United States Patent [19]
Mohsen

[11] 3,986,059
[45] Oct. 12, 1976

[54] ELECTRICALLY PULSED CHARGE REGENERATOR FOR SEMICONDUCTOR CHARGE COUPLED DEVICES

[75] Inventor: Amr Mohamed Mohsen, North Plainfield, N.J.

[73] Assignee: Bell Telephone Laboratories, Incorporated, Murray Hill, N.J.

[22] Filed: Apr. 18, 1975

[21] Appl. No.: 569,580

[52] U.S. Cl............................ 307/304; 307/221 D; 357/24
[51] Int. Cl.²................ H01L 29/78; G11C 19/28
[58] Field of Search........... 307/221 C, 221 D, 304, 307/208; 357/24

[56] References Cited
UNITED STATES PATENTS

| | | | |
|---|---|---|---|
| 3,623,132 | 11/1971 | Green | 357/24 X |
| 3,758,794 | 9/1973 | Kosonocky | 357/24 X |
| 3,789,247 | 1/1974 | Beausoleil et al. | 307/304 |
| 3,819,954 | 6/1974 | Butler et al. | 357/24 X |
| 3,876,989 | 4/1975 | Bankowski et al. | 307/221 D X |
| 3,881,117 | 4/1975 | Tompsett | 307/221 D |

OTHER PUBLICATIONS

Terman, "Charge–Coupled Device Shift Register Read/Write/Regeneration Circuit," IBM Tech. Discl. Bull., vol. 14, No. 12, pp. 3784–3785, May 1972.

Dennard et al., "Read/Write Amplifier for Charge–Coupled Device Memory," IBM Tech. Discl. Bull., vol. 14, No. 12, pp. 3722–3723, May 1972.

Dennard, "Regeneration Circuit for Charge–Coupled Device Shift Registers," IBM Tech. Discl. Bull., vol. 14, No. 12, pp. 3791–3792, May 1972.

Primary Examiner—John S. Heyman
Assistant Examiner—Larry N. Anagnos
Attorney, Agent, or Firm—D. I. Caplan

[57] ABSTRACT

A charge regenerator for a semiconductor charge transfer device is disclosed in which the regenerator contains an input diode which is subjected to a pulsed voltage. The signal to be regenerated is applied to a control gate electrode which controls the surface potential of the underlying semiconductor surface region located between the input diode and an auxiliary transfer cell feeding an array of output charge transfer cells. After termination of the diode pulse, charges flow back from the auxiliary transfer cell to the input diode through the control gate region such that the charge remaining in the auxiliary transfer cell is independent of the signal level on the control gate so long as this signal level is above a threshold for the injection of charges from the input diode to the auxiliary transfer cell and is zero otherwise.

10 Claims, 6 Drawing Figures

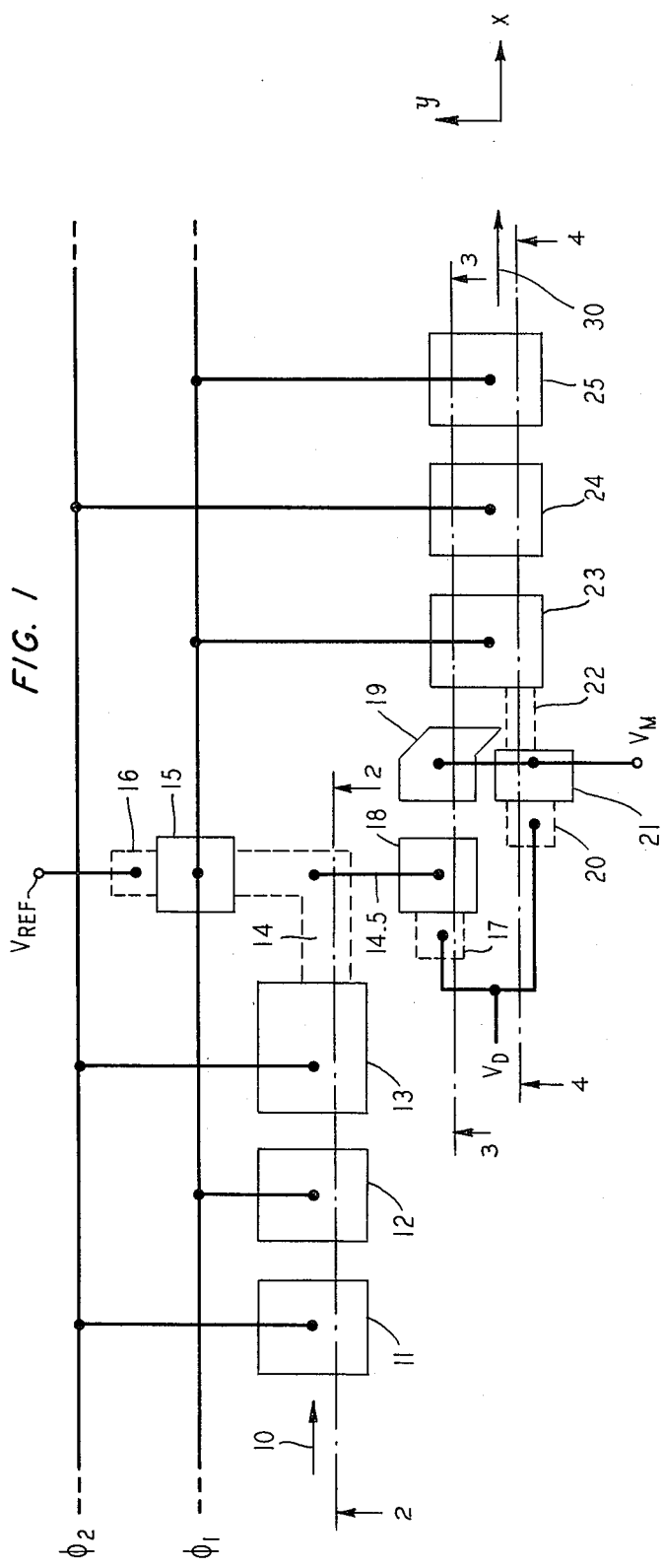
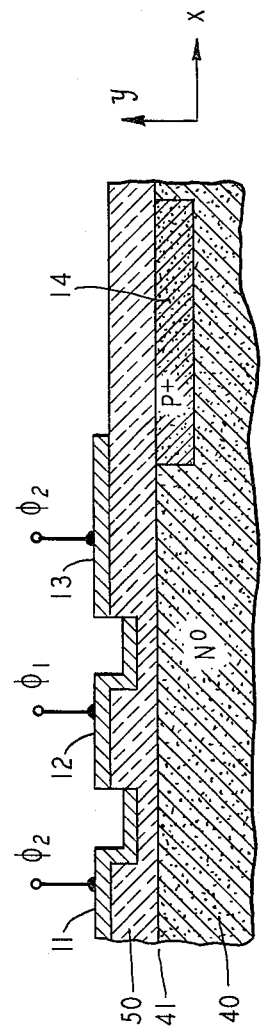
FIG. 1
FIG. 2

ELECTRICALLY PULSED CHARGE REGENERATOR FOR SEMICONDUCTOR CHARGE COUPLED DEVICES

FIELD OF THE INVENTION

This invention relates to the field of semiconductor apparatus and more particularly to semiconductor charge transfer devices.

BACKGROUND OF THE INVENTION

As known in the art of semiconductor charge transfer devices, in many applications it is required to regenerate a stream of information bits in the form of charge packets circulating through the device. This requirement for regeneration arises from the fact that charge transferred from one semiconductor transfer cell to the next is not perfect, portions of charge from each binary digital information bit corresponding to a "full" cell being left behind in trailing bit locations. See, for example, "A Simple Charge Regenerator for Use With Charge-Transfer Devices and the Design of Functional Logic Arrays", IEEE Journal of Solid-State Circuits, Vol. SC-7, No. 3, June 1972, pp. 237–242, at p. 238 in particular. In such regeneration processes, typically the regenerated signal stream is inverted with respect to the original stream, a digital "0" ("empty" cell) being regenerated as a digital "1" ("full" cell), and vice versa. Moreover, the digital 0 should advantageously be a "fat" zero, that is, from 5 percent to 25 percent of a full cell, in order to provide charge sufficient to keep traps in the device always full, so that these traps do not degrade the digital 1 signals. While charge regenerators have been described in the prior art for restoring input digital 0 to a full cell output digital 1, and an input digital 1 to a fat zero type output digital 0; the amount of output regenerated charge corresponding, for example, to the output digital 1 depends upon a reference voltage used in the detecting network for sensing the charge in the transfer cell whose charge is to be regenerated. Thus, fluctuations in this reference voltage lead to fluctuations in the regenerated charge which, over a period of time, can seriously degrade the information circulating in the charge transfer device. Accordingly, it would be desirable to have a charge regenerator for a charge transfer device in which an injected "full" cell contains an amount of charge which is independent of the reference voltage in the regenerator.

SUMMARY OF THE INVENTION

An array of input charge transfer cells feeds an input charge signal stream of charge packets containing binary information to a charge regenerator network which in turn feeds an output regenerated charge signal stream of binary information charge packets to an array of output charge transfer cells. The cells are defined by electrodes overlying a major surface of a single crystal semiconductor substrate. In the charge regenerator, a control gate electrode is situated between an input diode and an initial output transfer cell feeding the other output transfer cells. A voltage is applied to the control gate electrode in accordance with the input charge stream to be regenerated. The input diode is pulsed with a voltage sufficient to cause the flow of charges from the input diode to the auxiliary transfer cell when the voltage level on the signal control gate electrode is below a certain level (in the case of P-channel, above a certain level in the case of N-channel devices) and not otherwise. Upon the termination of the pulse, some of the charges, if any are then in the auxiliary transfer cell, flow back to the input diode, thereby leaving behind in the auxiliary transfer cell an amount of charge, if any, which depends upon the parameters of the auxiliary cell, such as the surface potential barrier at the intersection between two different electrode levels associated with the auxiliary transfer cell. In the event that the voltage level applied to the control gate was above the predetermined level, and hence no charges could flow from the input diode to the auxiliary transfer cell, then the auxiliary transfer cell after the termination of the diode pulse will be left with no charges remaining therein. Thus, an amount of charge is left remaining in the auxiliary transfer cell corresponding either to a full cell or an empty cell, the amount of charge corresponding to the full cell being independent of voltages applied to the regenerator network so long as these voltages are within reasonable ranges.

In order to obtain a "fat zero" amount of charge in the initial output transfer cell fed by the auxiliary transfer cell, a merging parallel channel is provided to supply a fat zero amount of charge to this output transfer cell. Thus, in addition to the charges flowing into the initial output transfer cell from the auxiliary transfer cell, the fat zero amount of charge is thereby fed to the initial transfer cell whether or not any charge is being fed by the auxiliary transfer cell. Thereby, independently of signal to be regenerated in the regenerator of this invention, a fat zero amount of charge can be fed into this initial transfer cell for further transfer through the charge transfer device.

In a specific embodiment of the invention, a P-type channel charge-coupled device includes a charge regenerator in accordance with the invention. The charge regenerator senses the flow of charge to the final transfer cell of the input charge transfer array of input transfer cells. The regenerator applies a voltage corresponding to the level of this charge to the control gate electrode which controls the surface potential in the underlying semiconductor control gate surface region located between an input diode and an auxiliary transfer cell which feeds the array of output transfer cells. The auxiliary transfer cell is advantageously associated with a two (or more) oxide-level electrode. While this voltage is being applied to the control gate electrode, a pulse is applied to the input diode sufficient to cause the injection of charges through the control gate region to the auxiliary transfer cell provided the voltage on the control gate electrode is then below a predetermined level corresponding to an empty input cell (input digital 0); otherwise, no charge is shifted from the input diode to the auxiliary transfer cell (input digital 1). At the termination of the diode pulse, the shifted charges, if any, in the auxiliary transfer cell will then flow back to the input diode, thereby leaving remaining in the auxiliary transfer cell an amount of charge for an input digital 0 which depends only on parameters of the auxiliary cell such as the surface barrier potential difference in the auxiliary transfer cell at the boundary between the different electrode levels of the overlying electrodes associated with the auxiliary transfer cell; but no charge is thereby shifted to the auxiliary transfer cell for an input digital 1. This auxiliary cell then feeds an array of output transfer cells. Thus, the regenerator inverts the input stream and produces an output stream of either completely full vs. empty charge packets corresponding to filled auxiliary transfer cells vs. empty auxiliary cells. The auxiliary cell can be maintained at a constant voltage level, rather than be controlled by the clock voltage lines which drive the input and output arrays, thereby affording flexibility of design for minimum geometry of the output transfer cells.

BRIEF DESCRIPTION OF THE DRAWING

This invention, together with its drawings, features, and objects can be better understood from the following detailed description when read in conjunction with the drawings in which:

FIG. 1 is a top-view diagram of a charge regenerator for a charge transfer device, in accordance with a specific embodiment of the invention;

FIG. 2 is a cross-section diagram of a section of the device shown in FIG. 1;

Figure 3:
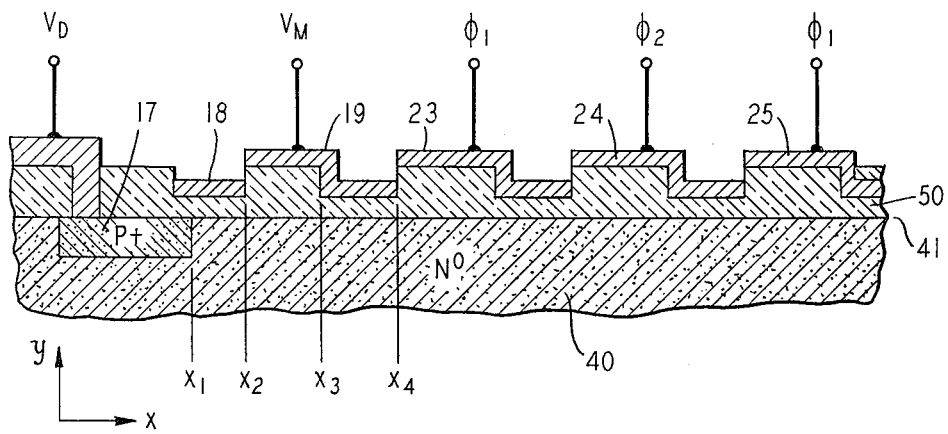
FIG. 3 is a cross-section diagram of another section of the device shown in FIG. 1.

For the sake of clarity only, none of the drawings is to any scale.

DETAILED DESCRIPTION

As shown in FIG. 1, an input array of charge transfer device produces a stream of information bits in the form of a stream 10 of input charge packets feeding the last stages of this input array represented by input transfer electrodes 11, 12, and an output electrodee 13. These electrodes can advantageously take the form, as shown in FIG. 2, of two-oxide-level electrodes controlled by and connected to a pair of clock voltage pulse lines, $\phi_1$ and $\phi_2$. The voltages on the clock lines $\phi_1$ and $\phi_2$ are complementary (FIG. 5) except for overlapping during time intervals $\Delta t$, as known in the art to be useful for sequential charge transfer of charge packets. The electrodes 11, 12 and 13 are imbedded in a silicon dioxide layer 50 on a silicon semiconductor substrate 40. The substrate 40 is typically monocrystalline silicon having relatively low electrical conductivity owing to a substantially uniform wet donor impurity concentration of typically about $10^{16}$ per cubic centimeter. Typically, the thickness of the silicon dioxide layer 50 is about 3,000 Angstroms (thick oxide), but the distance of closest approach (lower level) of each of the electrodes is about 1,000 Angstroms (thin oxide) with respect to the top surface 41 of the silicon substrate 40.

Underneath the extreme right-hand portion of the final input electrode 13 is located an L-shaped (FIG. 1) $p^+$ (strongly p) type surface region (FIG. 2) 14 having a net significant impurity doping level of the order of $10^{19}$ acceptors per cubic centimeter. The $p^+$ region 14 serves as the drain region of an insulated gate field effect transistor (IGFET) having a gate electrode 15 and a $p^+$ source region 16 fed by a reference voltage $V_{REF}$. This IGFET gate electrode 15 is coupled directly to the $\phi_1$ clock pulse line. The $p^+$ region 14 is connected ohmically, typically by means of metal contact connector metallization 14.5, to a signal control gate electrode 18 (FIG. 3) located at about 1,000 Angstroms from the top surface 41 of the silicon substrate 40. Electrode 18 serves as a signal control gate electrode for controlling the injection of minority positive hole carriers from an input diode region 17 of $p^+$ electrical conductivity to a surface region underlying an auxiliary transfer electrode 19. The voltage of the input diode region 17 is controlled by a pulse voltage $V_D$ to be described more fully below. Output transfer electrodes 23, 24 and 25 are similar to the previously described input electrodes 11, 12 and 13, and all these electrodes are connected to the clock pulse lines $\phi_1$ and $\phi_2$ as indicated. Typically these electrodes 11, 12, 13, 23, 24, 25 are about about 16 microns long in the propagation direction (left-right), that is about 10 microns long in the thin oxide (step) region and about 6 microns long in the thick oxide (step) region; whereas these electrodes are all typically about 10 to 20 microns wide (perpendicular to the propagation direction). As described more fully below, after regeneration by the operation of the diode pulse voltage $V_D$ in conjunction with the control gate 18, an output stream 30 (FIG. 1) is produced which is an inverted representation of the input stream 10.

Figure 4:
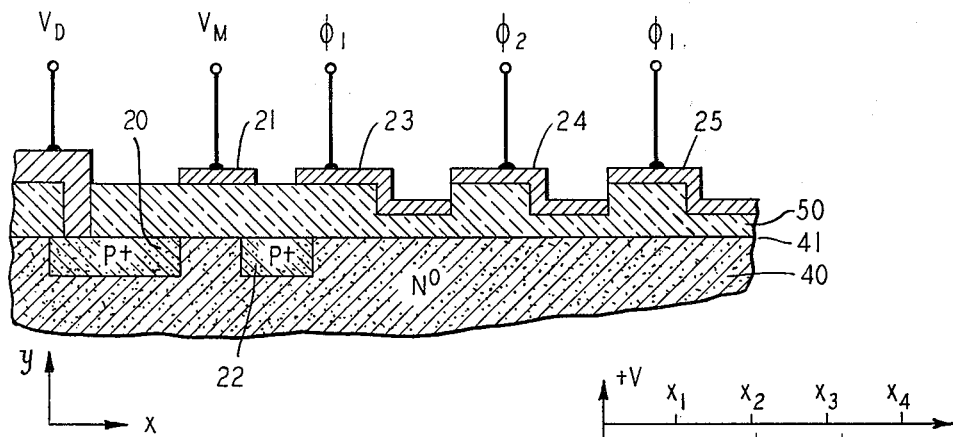
FIG. 4 is a cross-section diagram of yet another section of the device shown in FIG. 1.

An auxiliary transfer electrode 19, located between the control gate electrode 18 and the first output transfer electrode 23, is maintained at a D.C. voltage $V_M$, to be described more fully below. This electrode 19 together with the surface region underlying this electrode 19 defines an auxiliary transfer cell. As indicated in FIG. 4, a second input diode region 20 controlled by the diode pulse voltage $V_D$ is located in the semiconductor substrate 40. The right-hand edge of this diode region 20 underlies the left-hand edge of an auxiliary fat zero transfer electrodee 21, also controlled by the voltage $V_M$. Located underneath the right-hand edge of $V_M$ is an auxiliary $p^+$ type region 22 whose right-hand edge is terminated underneath the left-hand edge of electrode 23, as indicated in FIGS. 1 and 4.

Figure 5:
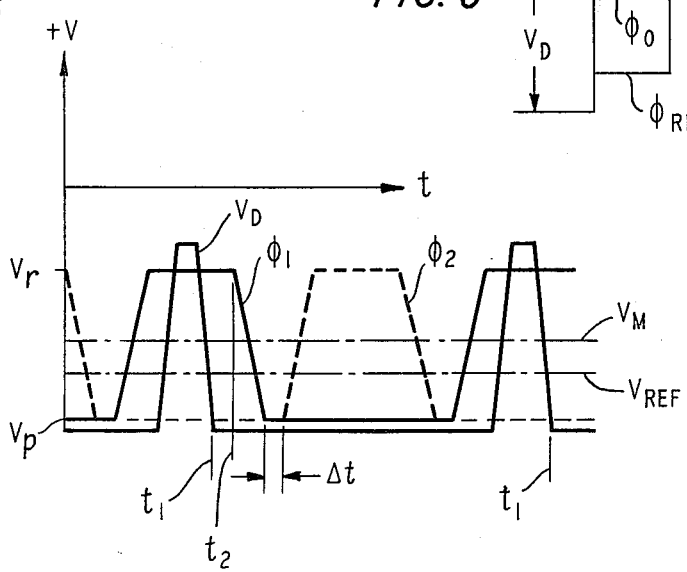
FIG. 5 is a plot of applied voltages vs time, useful in describing an operation of the device shown in FIG. 1.

The voltages to be applied in connection with the regenerator network shown in FIG. 1 are indicated in FIG. 5. In particular, the clock pulse voltages $\phi_1$ and $\phi_2$ alternate between a resting (inactive or passive phase) value $V_r$ and a pulsed (active phase) value $V_p$. Advantageously, the clock phases have common intervals $\Delta t$ during which both $\phi_1$ and $\phi_2$ are at their pulsed value $V_p$ (common active phase). In view of the negative voltage character of these voltages during the pulsed phase $V_p$ of the clocks $\phi_1$ and $\phi_2$, the corresponding underlying surface region of the semiconductor 40 will be deeply or heavily depleted during the active phases; whereas, during the resting phases, when the clock voltages are at $V_r$ (below threshold), there will be no such deep depletion, but only slight depletion, of the corresponding underlying region of the semiconductor substrate 40. Typically, $V_r$ is about $-8$ volts and $V_p$ is about $-18$ volts. Thereby, the semiconductor surface regions underlying the electrodese to which $V_p$ is applied are at surface potentials of about $-16$ volts where the electrodes approach the surface at 1,000 Angstroms (thin oxide), and are at about $-11$ volts where the electrodes approach the surface at about 3,000 Angstroms (thick oxide). The reference voltage $V_{REF}$ is typically about $-15$ volts, while $V_M$ is typically about $-14$ volts.

Figure 6:
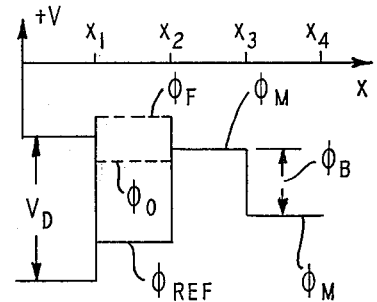
FIG. 6 is a plot of semiconductor surface potential vs. distance, also useful in describing the operation of the device shown in FIG. 1.

During operation, when the clock line $\phi_1$, is at its pulsed value $V_p$ (active phase), then the IGFET associated with the gate electrode 15 is On (inverted surface channel region). Thereby the voltage potential $V_{REF}$, to which the source region 16 is connected, is applied to the control gate electrode 18 (through the p$^+$ region 14 and the metal contact connector 14.5). Accordingly, the surface potential under this control gate electrode will be $\phi_{REF}$, typically about −13 volts, which is advantageously below the surface potential $\phi_M$ (FIG. 6, typically about −9 volts, under the left-hand (thick oxide) portion of the auxiliary transfer electrode 19. Thereafter, when the clock line $\phi_1$ goes to its resting value $V_r$ (inactive phase), the IGFET gate region underneath the electrode 15 (controlled by $\phi_1$) is then turned off (not inverted). Therefore, the potential of the electrode 18 during the inactive phase of $\phi_1$, is then directly controlled and coupled to the voltage (and hence charge) in surface region 14, which is determined by the charges entering this region 14 from underneath the final input electrode 13 then in the pulsed (active) phase of $\phi_2$. Accordingly, commencing during the beginning of the resting phase of 100 $_1$ (active phase of $\phi_2$), the control gate electrodee 18 has its potential responsive to the charge packet underlying this final input electrode 13, which stems from the input stream 10. As indicated in FIG. 6, during this resting phase of $\phi_1$, the surface potential underneath the control gate electrode 18 will be approximately equal to either $\phi_O$ or $\phi_F$ depending upon whether the p$^+$ region 14 is empty or full, whereas the surface potential $\phi_M$ underneath the auxiliary electrode 19 will take on a step profile corresponding to the thin oxide portion ($X_3X_4$) and thick oxide portion ($X_2X_3$) underlying this electrode. Commencing at a time during this inactive phase of $\phi_1$, a diode pulse $V_D$ is applied; that is, $V_D$ goes from its resting value of typically about −18 volts (about the same as the pulsed value $V_p$ of the clock phases $\phi_1$ and $\phi_2$) to its pulsed value, typically about −6 volts which is advantageously higher than both $\phi_M$ in the interval $X_2X_3$ and the resting value $V_r$ of the clock phases $\phi_1$ and $\phi_2$. The control gate surface potential $\phi_O$, corresponding to an empty cell in the p$^+$ region 14 is arranged to be typically about −8 volts which is less than the diode pulse level of about −6 volts; whereas the control gate surface potential $\phi_F$, corresponding to a full cell, is typically about −4 volts which is greater than the diode pulse level. This corresponds to a signal control gate electrode 18 voltage of about −6 volts for an empty cell and about −10 volts for a full cell, which is achieved by suitable design tailoring of the size of the p$^+$ region 14. On the other hand, as mentioned above, the voltage $V_M$ applied to the auxiliary electrode 19 typically is about −14 volts, so that the corresponding surface potential $\phi_M$ is about −12 volts under the thin oxide (right-hand $X_3X_4$) region and about −7 volts under the thick oxide (left-hand $X_2X_3$) region (FIG. 6). Consequently, when the input diode 17 is pulsed, positive charges will flow from the pulsed diode to the auxiliary transfer cell associated with the auxiliary transfer electrode 19 if $\phi_O$ (below $V_D$) is then the approximate surface potential of the control gate, but not if $\phi_F$ (above $V_D$) is then the approximate surface potential. The dividing line is just $V_D$ so long as $\phi_M$ in $X_2X_3$ remains below $V_D$; otherwise the dividing line is $\phi_M$ itself in $X_2X_3$ so long as it remains below $\phi_F$. Thus, $\phi_M$ in $X_2X_3$ and $V_D$ should both lie between $\phi_O$ and $\phi_F$, with $V_D$ higher than $\phi_M$ in $X_2X_3$ in all events. Consequently, in response to the diode voltage pulse $V_D$ to the diode region 17, minority hole carriers will flow from this diode region 17 to the surface portion ($X_3X_4$) of the semiconductor 40 underlying the thick oxide portion of the auxiliary electrodee 19 then being held at voltage $V_M$ only if the voltage on the signal control gate electrode 18 is then sufficiently negative, that is, sufficient to produce an underlying semiconductor surface potential which is below the pulsed diode level. If indeed this voltage of the control gate 18 is sufficiently negative, then positive hole charges will flow in response to the diode pulse from the input diode 17 to the surface region underneath the auxiliary electrode 19, provided of course that the maximum value of $\phi_M$ is sufficiently negative, that is, below the pulsed diode voltage level. The value of $V_{REF}$ should also be such that the surface potential under the left-hand (thick oxide) edge ($X_2$) of the auxiliary electrode 19 is higher than $\phi_{REF}$, the surface potential in the control gate region when $V_{REF}$ is applied to the control gate electrode 18. It should be noted that consequently the region ($X_2X_4$) underneath the auxiliary electrode 19 will be filled in response to the diode pulse only in the case of an empty cell in the p$^+$ region 14 causing a surface potential $\phi_O$ below the pulsed diode. The information then in region 14 (in the form of positive charges from underneath electrode 13) is thus inverted, an empty cell underneath electrode 13 being reflected in a full cell underneath electrode 19, and vice versa.

After terminatin of the diode pulse $V_D$, and during the remaining resting phase $t_1t_2$ (FIG. 6) of $\phi_1$, charges, if any, underneath electrode 19 will flow back to the input diode region 17 until the surface potential barrier $\phi_B$ at $X_3$ (FIG. 6) underneath the thick oxide-thin oxide boundary of the auxiliary electrode 19 prevents any further flowback of these charges to input diode 17. Thus, during the remaining resting phase of $\phi_1$ after the pulse $V_D$ is terminated, there will be remaining an amount of positive charge underneath the thin oxide ($X_3X_4$) poortion of the auxiliary electrode 19 (but only if any positive charge was originally shifted thereto by the diode pulse), which depends only on this difference $\phi_B$ of surface potential between thick oxide and thin oxide underlying surface semiconductor regions. It should also be noted of course that there will no charge remaining under even the thin oxide portion of electrode 19 in case the control gate 18 was at a potential just prior to $t_1t_2$ such that no charges could flow from the input diode 17 to the region underneath the gate electrode 19 even in the presence of the diode pulse $V_D$. Upon termination of $t_1t_2$ and the commencement of the active phase of $\phi_1$ followed by the commencement of the resting phase of $\phi_2$, the charges underneath the thin oxide portion of electrode 19, if any, will then flow to the semiconductor region underneath the first output transfer electrode 23, for further transfer subsequently during still later phases of the clock lines to the semiconductor regions under the output transfer electrodese 24 and 25, sequentially and successively, as understood in the art.

It is thus important that the surface potential $\phi_O$ be less than $\phi_M$ in the left-hand (thick oxide) region $X_2X_3$ FIG. 6) underlying the auxiliary electrode 19, in order to enable the flow back of charges; and that $\phi_F$ be greater than $\phi_M$ in this region $X_2X_3$ in order to discriminate between a digital 1 and 0; that is, in order to enable charge to flow from the input diode to the auxiliary transfer cell if and only if $\phi_O$ is the established in the signal control region $X_1X_2$ but not if $\phi_F$ is established thereat. Likewise, it is important that $\phi_M$ in the interval $X_2X_3$ be less than the pulsed value level $V_D$ of the input diode, in order to enable charges to flow into the auxiliary transfer cell if and when $\phi_O$ is established in the signal control region. On the other hand, it is important that $V_{REF}$ be sufficiently low to act as a sink for the removal of the signal charges remaining in the p$^+$ region 14 and on the signal control gate electrode 18 during the active phase of $\phi_1$ when the IGFET associated with electrode 15 turns on, that is, after the flowback of charges (if any) from the auxiliary transfer to the input diode during $t_1t_2$ in order to reset the regenerator for the next cycle. In any event, $\phi_{REF}$ should thus be below $\phi_O$ for this purpose. Thus, the injected charge packet remaining in the auxiliary transfer cell, for further transfer, is independent of the diode pulse voltage as well as the reference voltage, $V_{REF}$ provided that this reference voltage be sufficiently low to collect the signal charges on the signal control gate and in the p$^+$ region 14 during the active phase of $\phi_1$ (when $V_{REF}$ is being applied to the signal control gate electrode 18 through the turned on IGFET associated with the gate electrode 15).

As known in the art, it is also important in semiconductor charge transfer devices to have a fat zero representative of an output binary 0 bit. This requirement stems from the fact that impurity trapping levels in the semiconductor tend to absorb charges being transferred through the device and hence degrade the signals in a full cell. Thus, instead of having a binary digital 0 being represented by a completely empty cell, the traps are constantly fed to satiation by these charges in the fat zeros, that is, a zero bit is represented by from about 5 to 25 percent of the charge corresponding to a full cell. Typically, for a surface channel type (as opposed to bulk channel type) of semiconductor charge transfer device, a fat zero is represented by about 20 percent of the charge level of a full cell representing a digital 1. Accordingly, the portion of the device indicated in FIG. 4 is for the purpose of supplying such a fat zero. In such a case, however, the amount of charge supplied by the region underneath the auxiliary electrode 19 should be designed to be about 80 percent of a full cell underneath the first transfer electrode 23 so that when added to the charge supplied by the portion of the device shown in FIG. 4 a digital 1 is represented by a 100 percent level of charges under the first transfer electrode 23 and a digital 0 is represented by a 20 percent level. On the other hand, a full cell associated with the first electrode 23 is advantageously made somewhat (10 to 20 percent) less than an actually full cell in the output array, in order to prevent spillage of full cell charges. This can be accomplished by widening the lateral width of the output transfer electrodes 23, 24, 25, etc., relative to the auxiliary electrode 19, or by lengthening these electrodes' thin oxide portions.

In FIG. 4, the same voltage $V_M$ is applied to a fat zero electrode 21 as was applied to the auxiliary electrode 19. However, fat zero electrode 21 advantageously does not have any thin oxide portion, thereby enabling good control over fat zero charge packet injection in a minimum geometry device by minimizing the electrical capacitance and a more compact lateral geometry by keeping this electrode 21 out of the way of the auxiliary electrode 19 where it merges with the fat zero channel feeding the output cell under electrode 23. The capacity for storing charge of a p$^+$ surface region 22 located underneath the space between the first transfer electrode 23 and the fat zero electrode 21 is advantageously made smaller than the capacity of storing charge in the region underlying the thin oxide portion ($X_3X_4$) of electrode 19. Typically, the ratio of these capacities is adjusted so that a fat zero is only 20 percent of a full cell underneath the thin oxide portion of the first output transfer electrode 23. In any event, a fat zero is advantageously less than the charge of a full cell under the auxiliary electrode 19.

Summarizing the operation of the charge regenerator shown in FIG. 1, the charge underneath the last input electrode 13 is fed to the p$^+$ region 14 and is regenerated underneath the first output transfer electrode 23 such that the charge in region 14 coming from the thin oxide portion underneath the last input transfer electrode 13 will be inverted and regenerated under the first output transfer electrode 23. Specifically, if the charge delivered to the p$^+$ region 14 is sufficient to apply a signal voltage to the signal control gate 18 so as to cause flow of charges from the diode region 17 to the surface region underneath the auxiliary transfer electrode 19 in response to the diode pulse, only then will a digital 1 (full cell) result underneath this auxiliary transfer electrode 19. In all events, either a full cell or a fat zero results in the surface region of semiconductor underneath the first output transfer electrode 23 for further transfer through the device in the output stream 30.

It shall be obvious that the above description has been in terms of P channel charge transfer (of positive holes) in an N type semiconductor substrate, and that N channel charge transfer (of negative electron) can be similarly accomplished in P type semicondcutor with a polarity reversal of the applied voltages. Thus, whereas a signal voltage to be applied for example to the control gate electrode has been described as being below a certain level for P-channel devices, such a voltage should be above (below in negative voltage sense) a certain level for N-channel devices. In all events, the charge corresponding to a full cell associated with the first output transfer electrode 23 versus an empty cell will be independent of the reference voltage $V_{REF}$ applied to the IGFET source region 16. Thereby, the voltage window of discrimination between an input binary 1 bit versus an input binary 0 bit in the input stream 10 is larger than in the case where the regenerated charges depend upon $V_{REF}$. Another advantage of using $V_M$, a steady voltage, over a clock voltage $\phi_2$ applied to the auxiliary transfer electrode 19 arises from the fact that the full cell will then be independent of sudden wide fluctuations in the clock voltage line $\phi_2$.

While this invention has been described in terms of specific embodiment, various modifications can be made without departing from the scope of the invention. For example, instead of applying $V_M$ to the control gate electrode 19, the voltage from clock phase line $\phi_2$ may be applied to this electrode, as well as to the fat zero electrode 21. However, if the clock phase line $\phi_2$ is applied to the fat zero electrode 21, then p$^+$ region 22 should be omitted and, instead, the fat zero electrode 21 should be made into a 2-step type of electrode similar to the other transfer electrodes 23, 24 and 25; but the length of the thin oxide portion of this fat zero electrode should then be made of smaller charge storage capacity than that of the control gate electrode 19, and both of these electrodes should have shorter lateral widths than those of the other output transfer electrodes 23, 24 and 25 in order not to overfill the transfer cells associated with these latter electrodes. It should be noted, however, that the use of the voltage $V_M$, rather than the clock line $\phi_2$, applied to the auxiliary electrode 19 enables the use of minimum geometry for the remaining output transfer electrodes 23, 24, 25, etc., without suffering from spillage of full cells in these latter cells. Also, the final input transfer cell electrode 13 can be connected to a constant voltage source, such as $V_M$, instead of a clock line.

Other semiconductors than silicon, such as germanium or gallium arsenide, may also prove useful for charge transfer devices in the practice of this invention. While a multilevel electrode 19 is important to define $\phi_B$ in the auxiliary cell substantially independently of applied voltages; nevertheless, the other cells in the input and output arrays can be defined by single level electrodes under multiphase clock voltage control, as known in the art.

What is claimed is:

1. Semiconductor apparatus which comprises
  a. circuit means for applying an electrical signal to be regenerated to a signal control gate electrode overlying a signal gate semiconductor surface region, said gate region being situated between an input diode semiconductor region and an auxiliary transfer cell semiconductor region in a semiconductor medium, in order to produce a corresponding surface potential in the signal gate surface region of the semiconductor, the surface potential of first and second mutually contiguous surface portions of the auxiliary cell region being controlled by corresponding first and second portions of an auxiliary cell electrode separated by an insulating layer from said first and second surface portions respectively by first and second different thicknesses of the insulating layer, said different thicknesses thereby determining during operation a surface potential barrier in the auxiliary cell at the common boundary of the first and second surface portions, the first surface portion of the auxiliary cell being contiguous with the said signal gate surface region of the semiconductor; and
  b. circuit means for electrically pulsing the diode region to a pulsed voltage level while said signal is applied to the signal control gate sufficient to cause the flow of charges from said diode through the signal gate surface region into the auxiliary transfer cell if and only if the voltage signal to the signal control gate is then less than a first predetermined level and for terminating the said pulsed voltage level, the surface potential barrier in the auxiliary cell being sufficient that a portion of the charges in the axuiliary transfer cell after termination of the pulsed voltage level flow back through the signal gate surface region into the input diode while said voltage signal is still being applied to the signal control gate thereby leaving a first quantity of charge remaining in the second portion of the auxiliary transfer cell which is indpendent of fluctuations of the voltage signal to the signal control gate provided said signal remains less than the predetermined level during the pulsing of the diode.

2. Apparatus in accordance with claim 1 in which said means for applying the signal to the control gate include an input charge transfer cell and an insulated gate field effect transistor whose source region is connected to a reference voltage source acting as a sink for collecting charges on the signal control gate electrode after said flow back and whose drain is connected to the signal control gate, said first quantity of charge being thereby independent of the reference voltage, said drain region extending to the input transfer cell to which a sequence of charge packets to be regenerated is fed and which further includes clock voltage means connected to the gate of said insulated gate field effect transistor and also connected to a first output transfer electrode whose associated output transfer cell is fed by the charge remaining in the auxiliary transfer cell after the flow back, said reference voltage being sufficient to collect charges remaining in the input transfer cell and the signal control gate electrode after the flowback in order to reset the signal control electrode for a next cycle.

3. Semiconductor apparatus in accordance with claim 1 in which the semiconductor is silicon.

4. Apparatus according to claim 1 which further includes means for applying a D.C. voltage to the auxiliary cell electrode in order to produce surface potentials in the first and second surface portions of the auxiliary transfer cell which are substantially constant in time.

5. Semiconductor apparatus which comprises
  a. first means for providing an input stream of charge packets representative of binary bits of information in a surface region of a semiconductor medium;
  b. second means for sensing the input stream and for applying a voltage representative of said input stream to a signal control gate electrode, said signal control gate electrode being separated by an insulating layer from the surface of the medium thereby defining an underlying signal gate surface region in the medium located between an input diode region of the medium for injecting charges and an auxiliary transfer cell region in the medium for collecting charge from the diode region and for further transfer of an output regenerated stream of charge packets representative of the input stream, the surface potential of first and second mutually contiguous surface portions of the auxiliary cell region being controlled by corresponding first and second portions of an auxiliary cell electrode separated by an insulating layer from said first and second surface portions respectively by first and second different thicknesses of the insulating layer, said different thicknesses thereby determining during operation a surface potential barrier in the axuiliary cell at the common boundary of the first and second surface portions, the first surface portion of the auxiliary cell being contiguous with the said signal gate surface region of the semiconductor;
  c. circuit means for periodically applying a voltage pulse to the input diode region;
  d. circuit means connected to the auxiliary cell electrode for maintaining the surface potentials of the first and second surface portions of the auxiliary transfer cell for a time outlasting the voltage pulse at surface potentials sufficient to collect charges in said auxiliary cell injected from the input diode during each pulse to the input diode only when the surface potential of the signal gate region is at a voltage level below a first predetermined level during each pulse to the diode and not otherwise; such that some of charges thereby collected in the auxiliary cell can flow back through the signal gate region to the input diode after termination of the pulse to the diode while said signal is still being applied to the signal control gate electrode, thereby leaving behind in the second portion of the auxiliary cell a first amount of charge only if the signal control gate surface potential was below said first level; and e. circuit means for lowering the surface potential of the signal gate region to a reference potential level below a second predetermined level, whereby charges remaining on the signal control gate electrode after the flowback to the diode can blow to a reference voltage source of said reference level.

6. Apparatus according to claim 5 in which the first means include an insulated gate field effect transistor means having a source region which is maintained at the reference voltage potential, having a gate electrode which is connected and responsive to the input stream and having a drain which is connected to the signal control gate electrode.

7. Apparatus according to claim 6 which further comprises a first output transfer cell for periodically receiving the first amount of charge from the auxiliary cell and means controlled by the diode pulse for delivering in parallel with the auxiliary cell to the first output transfer cell a second amount of charge which is less than the first amount and which is independent of the voltage on the signal control gate electrode.

8. Apparatus according to claim 7 which further comprises first and second control clock voltage lines, the first output transfer electrode being connected to the first line, the gate of the IGFET being connected to the first line, and the input stream being provided by a final input transfer cell, the drain of the IGFET extending to said last final input transfer cell's associated surface region in the medium.

9. Semiconductor apparatus which comprises a. an array of input charge transfer cells in a semiconductor medium for the transfer of an input stream of charge packets to a final input cell;

b. circuit means coupled to said final input cell for applying a reference voltage below a first predetermined level to a signal control gate electrode during a sequence of first clock phases and for applying to said signal control gate electrode a signal representative of the charge packets in said final input cell during a sequence of second clock phases interlaced with the first phases;

c. circuit means for applying a voltage pulse to an input diode surface region of the medium for injecting charges through a signal gate surface region of the medium underlying the signal control gate electrode during a time interval within each and every second clock phase sufficient to cause the injection of charges through the control gate surface region to an auxiliary transfer cell only when the signal being applied to the signal control gate electrode during said second phase is below a second predetermined level but not otherwise, the surface potential of first and second mutually contiguous surface portions of the auxiliary cell region being controlled by corresponding first and second portions of an auxiliary cell electrode separated from said first and second surface portions respectively by first and second different thicknesses of an insulating layer, said differetn thicknesses thereby determining during operation a surface potential barrier in the auxiliary cell at the common boundary of the first and second surface portions, the first surface portion of the auxiliary cell being contiguous along another common boundary with the said signal gate surface region of the semiconductor, whereby some of said charges flow back to the input diode through the signal gate region as the termination of the diode pulse during said second clock phase thereby leaving in the auxiliary transfer cell a first quantity of charge forming a charge packet of size independent of the reference voltage below said first predetermined level whenever the signal during the immediately preceeding pulse was below said second predetermined level, said surface potential barrier in the auxiliary cell being sufficient for retaining said first quantity of charge.

10. Apparatus according to claim 9 which further includes a first output transfer cell for receiving charge packets from the auxiliary cell and which further includes a fat zero charge packet source for providing during every second phase a second quantity of charge less than the first quantity of charge to the first output transfer cell independent of the signal.

* * * * *

UNITED STATES PATENT AND TRADEMARK OFFICE
CERTIFICATE OF CORRECTION

PATENT NO. : 3,986,059
DATED     : October 12, 1976
INVENTOR(S) : Amr M. Mohsen

It is certified that error appears in the above-identified patent and that said Letters Patent are hereby corrected as shown below:

Column 3, line 9, "drawings" should read --advantages--; line 36, "electrodee" should read --electrode--; line 48, "wet" should read --net--. Column 4, line 57, "electrodese" should read --electrodes--. Column 5, line 19, "$100_1$" should read --$\phi_1$--. Column 6, line 36, "poortion" should read --portion--. Column 7, line 47, after "first" insert --transfer--. Column 8, line 7, "summarizing" should be capitalized. Column 11, line 8, "blow" should read --flow--. Column 12, line 18, "differetn" should read --different--.

Signed and Sealed this

Twenty-fifth Day of January 1977

[SEAL]

Attest:

RUTH C. MASON
Attesting Officer

C. MARSHALL DANN
Commissioner of Patents and Trademarks